United States Patent
Lee

(10) Patent No.: US 8,947,959 B2
(45) Date of Patent: Feb. 3, 2015

(54) MEMORY DEVICE AND COMPRESSIVE TEST METHOD FOR THE SAME

(75) Inventor: Kang-Youl Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 400 days.

(21) Appl. No.: 13/206,180

(22) Filed: Aug. 9, 2011

(65) Prior Publication Data

US 2012/0230137 A1   Sep. 13, 2012

(30) Foreign Application Priority Data

Mar. 9, 2011   (KR) ................. 10-2011-0020930

(51) Int. Cl.
| | | |
|---|---|---|
| G11C 7/00 | (2006.01) | |
| G11C 29/00 | (2006.01) | |
| G11C 29/40 | (2006.01) | |
| G11C 29/28 | (2006.01) | |
| G11C 29/26 | (2006.01) | |

(52) U.S. Cl.
CPC .............. *G11C 29/40* (2013.01); *G11C 29/28* (2013.01); *G11C 2029/2602* (2013.01)
USPC ...................................................... 365/201

(58) Field of Classification Search
None
See application file for complete search history.

(56) References Cited

U.S. PATENT DOCUMENTS

| | | | | |
|---|---|---|---|---|
| 5,726,994 | A * | 3/1998 | Matsuura et al. ............. | 714/718 |
| 6,163,863 | A * | 12/2000 | Schicht ......................... | 714/718 |
| 6,307,790 | B1 * | 10/2001 | Roohparvar et al. ..... | 365/189.05 |
| 6,331,958 | B2 * | 12/2001 | Tsukude ....................... | 365/201 |
| 6,650,582 | B2 * | 11/2003 | Matsumoto et al. .......... | 365/201 |
| 6,873,563 | B2 * | 3/2005 | Suwa et al. .............. | 365/230.03 |
| 7,168,018 | B2 * | 1/2007 | Cooper et al. ................ | 714/719 |
| 7,187,195 | B2 * | 3/2007 | Kim ................................ | 326/16 |
| 7,362,633 | B2 * | 4/2008 | Fekih-Romdhane ......... | 365/201 |
| 7,447,814 | B1 * | 11/2008 | Ekman ............................ | 710/68 |
| 7,562,268 | B2 * | 7/2009 | Seyyedy et al. ............... | 714/718 |
| 7,706,199 | B2 * | 4/2010 | Ku et al. ....................... | 365/201 |
| 7,940,597 | B2 * | 5/2011 | Kim ......................... | 365/230.03 |
| 8,024,627 | B2 * | 9/2011 | Song ............................. | 714/718 |
| 8,040,740 | B2 * | 10/2011 | Momma ................. | 365/189.05 |
| 8,107,307 | B2 * | 1/2012 | Chou ............................ | 365/201 |
| 8,203,387 | B2 * | 6/2012 | Choi .............................. | 330/297 |
| 2008/0159031 | A1 * | 7/2008 | Fekih-Romdhane ......... | 365/201 |
| 2009/0273991 | A1 * | 11/2009 | Song .............................. | 365/191 |

(Continued)

FOREIGN PATENT DOCUMENTS

| | | |
|---|---|---|
| KR | 1020050089900 | 9/2005 |
| KR | 1020090003641 | 1/2009 |

(Continued)

OTHER PUBLICATIONS

Office Action issued by the Korean Intellectual Property Office on Jul. 17, 2012.
Notice of Allowance issued by the Korean Intellectual Property Office on Jun. 20, 2013.

*Primary Examiner* — Kretelia Graham
(74) *Attorney, Agent, or Firm* — IP & T Group LLP

(57) ABSTRACT

A memory device includes a first bank, a second bank, a plurality of interface pads, and a data output unit configured to output compressed data of the first bank through at least one interface pad among the plurality of interface pads and subsequently output compressed data of the second bank through the one interface pad.

25 Claims, 9 Drawing Sheets

(56) References Cited

U.S. PATENT DOCUMENTS

2009/0327573 A1* 12/2009 Jang .................................. 711/5
2011/0103164 A1* 5/2011 Yun et al. ...................... 365/201

FOREIGN PATENT DOCUMENTS

| KR | 100913968 | 8/2009 |
| KR | 1020110002678 | 1/2011 |

* cited by examiner

MEMORY DEVICE AND COMPRESSIVE TEST METHOD FOR THE SAME

CROSS-REFERENCE TO RELATED APPLICATIONS

The present application claims priority of Korean Patent Application No. 10-2011-0020930, filed on Mar. 9, 2011, which is incorporated herein by reference in its entirety.

BACKGROUND

1. Field of the Invention

Exemplary embodiments of the present invention relate to a memory device, and more particularly, to a memory device and a method for testing the memory device.

2. Description of the Related Art

As memory devices become more highly integrated along with the advancements in memory device fabrication technology, the fabricated memory devices may be tested with expensive test equipment for a long time.

Among the test methods is a compressive test, or parallel test, for reducing the time taken for testing a memory device. Hereafter, the compressive test is described.

Testing thousands of cells at a high speed is as important as testing the cells with high reliability. Particularly, not only the time taken for developing a memory device, but also the time taken for testing a memory device directly affects the production cost of the product. Therefore, reducing the testing time is desirable.

Generally, when each cell of a memory chip of a memory device is tested to decide whether or not the memory chip has a failure, the production cost may be high and the time required for testing the memory device may be long.

Herein, a compressive test mode is used to reduce the time taken for testing the memory device. According to the compressive test method, the same data are written in a plurality of cells and then when the data are read, an exclusive OR logic gate (i.e., an XOR logic gate) is used. When the same data are read from the multiple cells, a '1' may be returned thereby determining that the memory device has passed the compressive test. Otherwise, if a different data is read from any one of the cells, a '0' may be returned thereby determining that the memory device has failed the compressive test.

Such a parallel test requires activating many banks all at once and performing a data read/write operations. According to conventional test technology, the data outputted from several banks pass through the above-described compressive process and are outputted through the respective interface pads corresponding to the banks. The test equipment then makes a pass/failure decision for the memory device in response to the data outputted from the interface pads.

For example, when it is assumed that one chip includes 8 banks and a compressive test is performed by outputting data from the 8 banks, the data are outputted through 8 interface pads. If test equipment includes 64 interface pads, the test equipment cannot help but test 8 chips at once.

In short, generally the number of interface pads of the test equipment equals the number of banks included in one chip, or the number of banks activated for one-time testing in one chip. And since it is not possible to test many chips all at once, it may take a long time to perform the conventional compressive test.

SUMMARY

Exemplary embodiments of the present invention are directed to a memory device for testing many chips all at once by decreasing the number of interface pads through which data are outputted in one chip when a compressive test is performed.

In accordance with an exemplary embodiment of the present invention, a memory device includes a first bank, a second bank, a plurality of interface pads, and a data output unit configured to output compressed data of the first bank through at least one interface pad among the plurality of interface pads and subsequently output compressed data of the second bank through the one interface pad.

The data output unit may include a selection information generator configured to generate selection information in response to the read command, and a line selector configured to select a group of global lines from among the plurality of global lines in response to the selection information and to transfer compressed data loaded onto the selected group of the global lines to the one interface pad.

The selection information generator may include a preliminary information generation circuit configured to generate preliminary selection information in response to the read command, and an information generation circuit configured to generate the selection information based on the preliminary selection information.

In accordance with another exemplary embodiment of the present invention, a memory device includes a plurality of bank groups each including at least one bank, a plurality of interface pads, and a data output unit configured to output compressed data of one bank group from among the plurality of bank groups to at least one interface pad from among the plurality of interface pads at once during a compressive test operation, wherein compressed data of different bank groups from among the plurality of bank groups are sequentially outputted.

The data output unit includes a selection information generator configured to generate selection information in response to the read command, and a line selector configured to select a group of global lines from among the plurality of global lines in response to the selection information and to transfer compressed data loaded onto the selected group of the global lines to the at least one interface pad.

In accordance with yet another exemplary embodiment of the present invention, a method for testing a memory device includes applying a read command, reading data from a first bank and data from a second bank in response to the read command, compressing the data read from the first bank and the data read from the second bank to thereby produce compressed data, outputting the compressed data of the first bank to at least one interface pad from among a plurality of interface pads in response to the read command, applying the read command a second time, and outputting compressed data of the second bank to the at least one interface pad in response to the second activation of the read command.

In accordance with still another exemplary embodiment of the present invention, a method for testing a memory device includes applying a read command, reading data from a plurality of banks in response to the read command, compressing the data read from the plurality of banks, outputting the compressed data of at least one bank from among the plurality of banks to at least one interface pad from among a plurality of interface pads in response to the read command, applying the read command a second time, and outputting compressed data of at least one other bank from among the plurality of banks to the at least one interface pad from among a plurality of interface pads in response to the second activation of the read command.

In accordance with yet another exemplary embodiment of the present invention, a memory system includes a bank controller configured to receive a bank address and a test signal, and to transfer a read command in response to the bank address and test signal, a plurality of banks configured to receive the read command and output normal data, a plurality of compression circuits configured to receive the normal data and generate compressed data when the test signal is enabled, a plurality of global lines configured to transfer the normal data or the compression data, a plurality of interface pads, wherein a selected interface pad from among the plurality of interface pads is coupled to test equipment, and a data output unit configured to receive data loaded onto the plurality of global lines, to output compressed data of at least one bank from among the plurality of banks through the selected interface pad, and to subsequently output compressed data of at least one other bank from among the plurality of banks through the selected interface pad.

DETAILED DESCRIPTION

Figure 1:
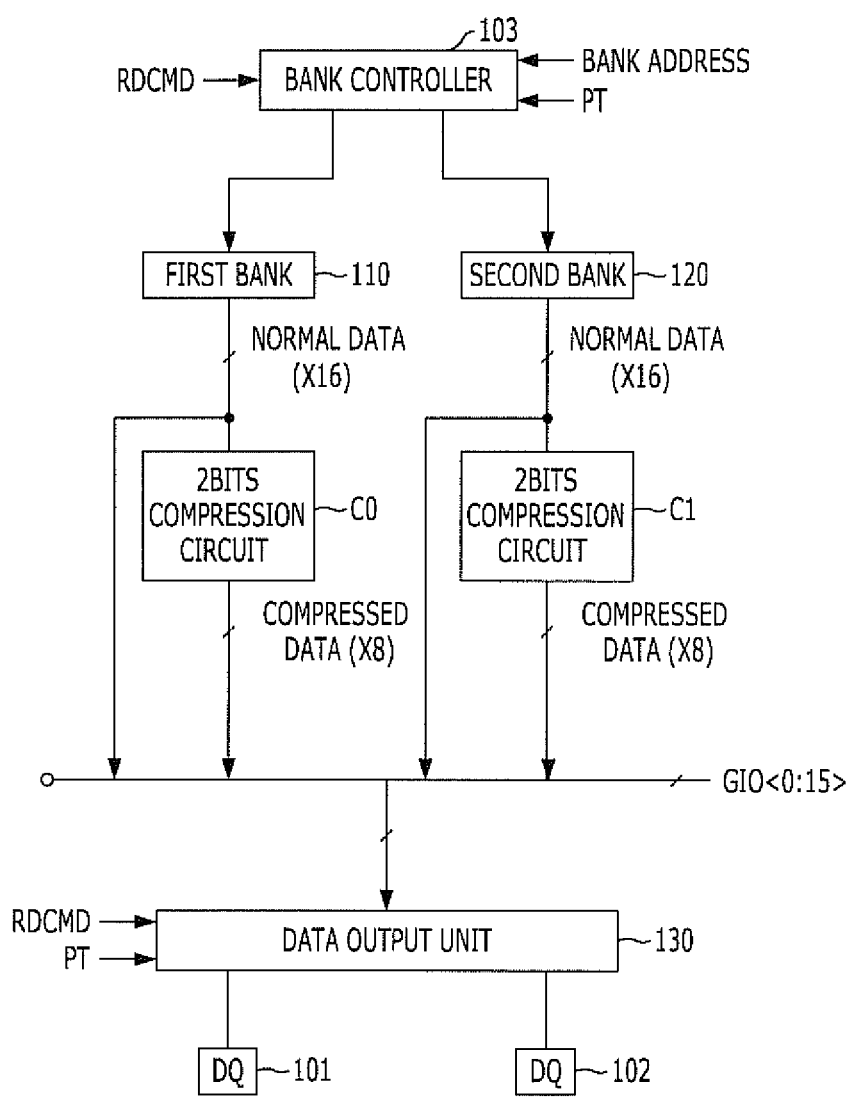
FIG. 1 is a block view illustrating a memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block view illustrating a memory device in accordance with an exemplary embodiment of the present invention.

Referring to FIG. 1, the memory device includes a first bank 110, a second bank 120, a plurality of interface pads 101 and 102, and a data output unit 130. The data output unit 130 outputs compressed data of the first bank 110 through one interface pad among the multiple interface pads 101 and 102, and then outputs compressed data of the second bank 120 through the other interface pad among the multiple interface pads 101 and 102.

In the exemplary embodiment of FIG. 1, a case where 16 bits of data are read from each of the first bank 110 and the second bank 120 in a normal mode and 8 bits of data are read in a test mode is shown. More specifically, 16 bits of data are read from each of the first bank 110 and the second bank 120 in response to a read command RDCMD. Further, compression circuits C0 and C1 are provided for each bank, and compress the 16 bits of data into 8 bits of compressed data. Accordingly, this compression scheme may be referred to as a 2:1 compression. In FIG. 1, "X16" denotes the number of read data, which is 16 bits, while "X8" denotes the number of compressed data, which is 8 bits.

When a memory device performs a general data output operation, which is referred to as a normal operation, hereafter, the data read from the first bank 110 and the second bank 120 and outputted to the outside of the memory device through the multiple interface pads 101 and 102 are referred to as normal data, hereafter. This normal data are output from the first bank 110 or the second bank 120 through global lines GIO<0:15> to the data output unit 130 without passing through the compression circuits C0 and C1. Also, when the memory device performs a test operation using compressed data, which is referred to as a compressive test operation, hereafter, the data read from the first bank 110 and the second bank 120 and compressed by the compression circuits C0 and C1 are referred to as 'compressed data.'

Referring to FIG. 1, an operation of the memory device is described, hereafter.

When the memory device performs a normal operation, a test signal PT is disabled, and when the memory device performs a 'compressive test operation,' the test signal PT is enabled. Herein, a case where the memory device performs a normal operation and a case where the memory device performs a compressive test operation are described separately.

(1) When the Memory Device Performs a Normal Operation

When the test signal PT is disabled, a bank controller 103 controls the memory device to read data from one bank designated by a bank address BANK ADD in response to a read command RDCMD. In other words, one bank designated by a bank address BANK ADD is activated. For example, if the bank address BANK ADD corresponds to the first bank 110, then data is read from the first bank 110 and not the second bank 120. Referring to FIG. 1, when the read command RDCMD is applied, 16 bits of data are read from the one bank designated by the bank address BANK ADD.

The 16 bits of normal data read from the one bank do not pass through the compression circuits C0 and C1, and instead, are loaded onto the plurality of global lines GIO<0:15>. Here, the 16 bits of normal data are loaded onto sixteen global lines GIO<0:15>, respectively. The data of the global lines GIO<0:15> are transferred to the data output unit 130, and go through a parallel-to-serial conversion in the data output unit 130 before being outputted to the outside of the memory device through the interface pads 101 and 102.

Hereafter, exemplary normal operations of a memory device are described.

In a first exemplary normal operation, when the read command RDCMD is applied while the test signal PT is disabled and the first bank 110 is designated by the bank address BANK ADD, the first bank 110 is activated and 16 bits of data are read from the first bank 110. The 16 bits of data are loaded onto the global lines GIO<0:15>, respectively.

The normal data loaded onto the global lines GIO<0:7> and the normal data loaded on the global lines GIO<8:15> go through a parallel-to-serial conversion. Then, the normal data loaded onto the global lines GIO<0:7> may be sequentially outputted to the outside of the memory device through the interface pad 101, and the normal data loaded on the global lines GIO<8:15> may be sequentially outputted to the outside of the memory device through the interface pad 102. Alternatively, all 16 bits of the normal data may be sequentially outputted through one of the interface pads 101 and 102.

In a second exemplary normal operation, when the read command RDCMD is applied while the test signal PT is disabled and the second bank 120 is designated by the bank address BANK ADD, the second bank 120 is activated and 16 bits of data are read from the second bank 120. The 16 bits of data read from the second bank 120 are loaded onto the global lines GIO<0:15>, respectively. Subsequently, the 16 bits of normal data read from the second bank 120 go through the same process (i.e., parallel-to-serial conversion) as the 16 bits of normal data read from the first bank 110 and are outputted to the outside of the memory device through one or more of the interface pads 101 and 102.

Since the present invention relates to the operation of a memory device during a compressive test operation, and since the process in which data are outputted during a normal operation is well known to those skilled in the art to which the present invention pertains, further description on the normal operation is not provided herein.

(2) When the Memory Device Performs a Compressive Test Operation

When the test signal PT is enabled, a bank controller 103 controls the memory device to read data from the first bank 110 and the second bank 120 in response to the read command RDCMD regardless of a bank address BANK ADD. In other words, both first bank 110 and second bank 120 are activated. Therefore, referring to FIG. 1, when the read command RDCMD is applied, a total of 32 bits of data are read from both of the first bank 110 and the second bank 120. That is, 16 bits of data are read from each of the first bank 110 and the second bank 120 in response to a first activation of the read command RDCMD.

The 16 bits of data read from the first bank 110 are compressed into 8 bits of compressed data in the compression circuit C0. Meanwhile, the 16 bits of data read from the second bank 120 are compressed into 8 bits of compressed data in the compression circuit C1. In short, 16 bits of compressed data are produced.

The 8 bits of compressed data of the first bank 110 are loaded onto the global lines GIO<0:7>, respectively. Also, the 8 bits of compressed data of the second bank 120 are loaded onto the global lines GIO<8:15>, respectively. Then, the 16 bits of data loaded onto the global lines GIO<0:15> are transferred to the data output unit 130. In sum, the compressed data of the first bank 110 and the compressed data of the second bank 120 are transferred through the global lines GIO<0:15> all at once in response to the first activation of the read command RDCMD.

The data output unit 130 transfers the compressed data of the first bank 110 to the outside of the memory device through one of the interface pads 101 and 102. For example, the data output unit 130 may transfer the compressed data of the first bank 110 loaded onto the zeroth to seventh global lines GIO<0:7> through the first interface pad 101 from among the multiple interface pads 101 and 102 in response to the first activation of the read command RDCMD. Subsequently, the compressed data of the second bank 120 are outputted to the outside of the memory device through the same interface pad used to output the compressed data of the first bank 110 in response to a second activation of the read command RDCMD. For example, the data output unit 130 may transfer the compressed data of the second bank 120 loaded onto the eighth to fifteenth global lines GIO<8:15> through the first interface pad 101 in response to the second activation of the read command RDCMD. In short, the compressed data of the first bank 110 and the compressed data of the second bank 120 are outputted through the same interface pad (e.g., the first interface pad 101), but at different output timings.

To this end, the data output unit 130 transfers the compressed data of the first bank 110 loaded onto the zeroth to seventh global lines GIO<0:7> to the interface pad 101 in response to the first activation of the read command RDCMD, and transfers the compressed data of the second bank 120 loaded onto the eighth to fifteenth global lines GIO<8:15> to the interface pad 101 in response to the second activation of the read command RDCMD.

Although the explanation above described a case where only the first interface pad 101 was used to output the compressed data, the number of the interface pads through which the compressed data are outputted may be changed according to how the memory device is designed. In other words, the memory device in accordance with the present invention does not have to output the compressed data through only one interface pad, but may output compressed data through a subset of interface pads from among a plurality of interface pads.

According to known technology, a memory device including two banks uses two interface pads during a compressive test operation. For example, in the known memory device, the global lines GIO<0:7> correspond to the interface pad 101, and the global lines GIO<8:15> correspond to the interface pad 102. Therefore, when a compressive test is performed on the known memory device using test equipment including 8 interface pads, only four of the known memory devices may be tested for each testing time.

On the other hand, according to the memory device of FIG. 1, the compressed data of the first bank 110 and the compressed data of the second bank 120 are sequentially outputted by using one interface pad 101. This is because the moment when the compressed data are transferred to the interface pad 101 is separated for each bank, and the memory device may be designed to transfer the compressed data loaded on the global lines GIO<0:15> to a target interface pad 101. Therefore, it takes one interface pad 101 to test one memory device. Thus, 8 memory devices in accordance with the present invention may be tested simultaneously by using the same test equipment having 8 interface pads. In short, the technology of the present invention is advantageous in that it may test more memory devices simultaneously than known technology.

Generally, it takes a long time to connect/disconnect a plurality of memory devices with test equipment. Thus, because the test equipment is capable of testing more memory devices at once, the connection/disconnection time may be reduced, which may lead to a decrease in overall testing time.

Figure 2:
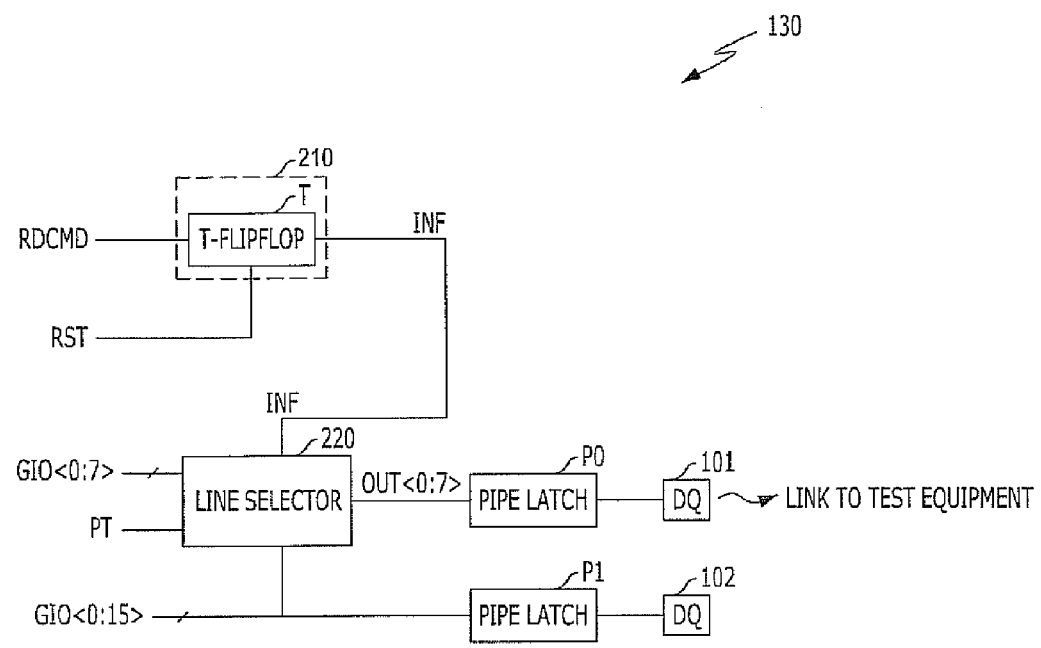
FIG. 2 is a block view illustrating a data output unit 130 shown in FIG. 1.

FIG. 2 is a block view illustrating a data output unit 130 shown in FIG. 1.

Referring to FIG. 2, the data output unit 130 includes a selection information generator 210 and a line selector 220. The selection information generator 210 generates selection information INF in response to the read command RDCMD. The line selector 220 selects a subset of global lines from among the plurality of global lines GIO<0:15> in response to the selection information INF, and transfers the compressed data loaded onto the selected global lines to a specific interface pad. For example, as shown in FIG. 2, the line selector 220 selects either the zeroth to seventh global lines GIO<0:7> or the eighth to fifteenth global lines, and transfers the compressed data loaded onto the selected global lines to the first interface pad 101. Also, the data output unit 130 includes pipe latches P0 and P1 for converting the data transferred in parallel through corresponding lines (e.g., zeroth to seventh global lines GIO<0:7>) into serial data and transferring the serial data to the interface pads 101 and 102.

Figure 3:
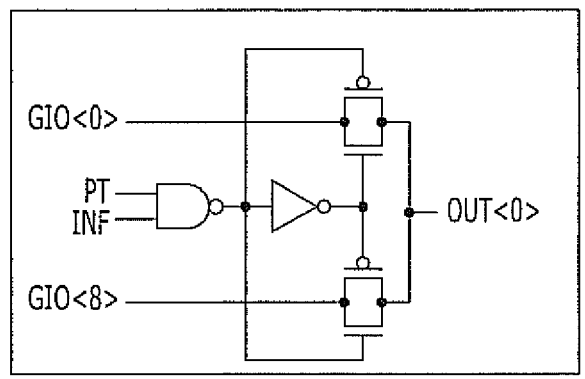
FIG. 3 illustrates a configuration of the line selector 220 shown in FIG. 2.
Figure 3:
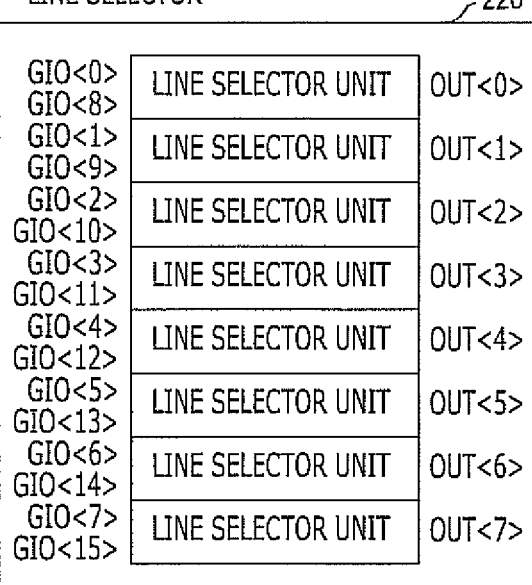

FIG. 3 illustrates a configuration of the line selector 220 shown in FIG. 2. As shown in FIG. 3, the line selector 220 may include a plurality of line selector units. Each line selector unit may be configured to select one of the global lines from among the plurality of global lines GIO<0:15> in response to the selection information INF and the test signal PT, and to transfer the compressed data loaded onto the selected global line to an output line coupled to a corresponding interface pad. For example, as shown in FIG. 3, a line selector unit may select the zeroth global line GIO<0> or the eighth global line GIO<8> based on the selection information INF and the test signal PT, and transfer the compressed data loaded onto the selected global line to an output line OUT<0> coupled to the first interface pad 101.

Figure 4:
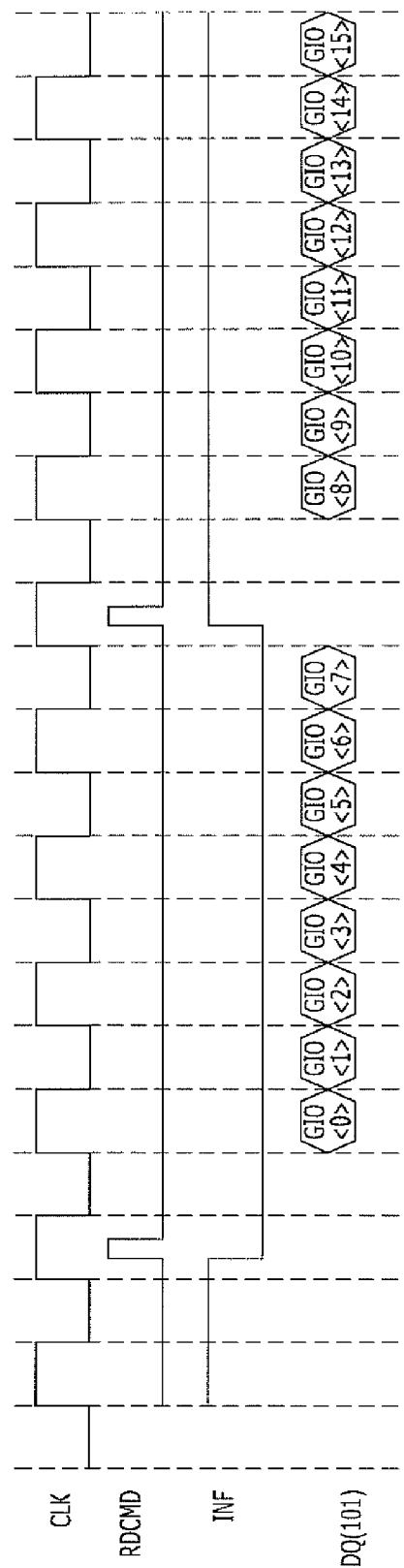
FIG. 4 is a timing diagram for illustrating an operation of the data output unit 130.

FIG. 4 is a timing diagram for illustrating an operation of the data output unit 130. FIG. 4 shows that the 8 bits of compressed data read from the first bank 110 and loaded onto the zeroth to seventh global lines GIO<0:7> may be sequentially output through the first interface pad 101 after the first activation of the read command RDCMD when the selection information INF is at a first logic level (e.g., a low logic level). Further, FIG. 4 also shows that the 8 bits of compressed data read from the second bank 120 and loaded onto the eighth to fifteenth global lines GIO<8:15> may be sequentially output through the first interface pad 101 after the second activation of the read command RDCMD when the selection information INF is at a second logic level (e.g., a high logic level).

Hereafter, an operation of the data output unit 130 is further described with reference to FIGS. 2-4.

The selection information generator 210 is used during a compressive test operation. The selection information generator 210 generates or updates the selection information INF whenever a read command RDCMD is applied. The selection information INF is a signal used when the line selector 220 selects global lines to be used. The value of the selection information INF changes whenever the read command RDCMD is applied.

As shown in FIG. 4, during a compressive test operation, the selection information INF, when the read command RDCMD is first applied, and the selection information INF, when the read command RDCMD is applied a second time, have different values. For example, when the first read command RDCMD is applied, the selection information INF may represent a '0' logic value, and when the second read command RDCMD is applied, the selection information INF may represent a '1' logic value.

To this end, the selection information generator 210 changes the logic value of the selection information INF whenever the read command RDCMD is applied. The selection information generator 210 may include a T-flipflop which receives the read command RDCMD as an input and outputs the selection information INF.

The selection information generator 210 shown in FIG. 2 is a mere example. Also, since the selection information INF has to have two different values in FIG. 2, the selection information INF may be a single digital signal representing one bit. Further, a reset signal RST may also be input to the selection information generator 210. The reset signal RST is a signal for initializing the selection information INF to a specific logic level, for example, a high logic level representing a '1'.

The line selector 220 transfers the compressed data of the global lines selected based on the selection information INF from among the plurality of global lines GIO<0:15> during the compressive test operation to a plurality of output lines OUT<0:7>. The data loaded onto the output lines OUT<0:7> go through a parallel-to-serial conversion in the pipe latch P0 and are outputted to the outside of the memory device through the first interface pad 101.

In the above example, when the selection information INF represents a logic value of '0', that is, when the read command RDCMD is first applied, the data loaded on the global lines GIO<0:7>, which are the compressed data of the first bank 110, are transferred to the output lines OUT<0:7>. When the selection information INF represents a logic value of '1', that is, when the read command RDCMD is applied a second time, the data loaded on the global lines GIO<8:15>, which are the compressed data of the second bank 120, are transferred to the output lines OUT<0:7>.

The line selector 220 transfers the data loaded onto the global lines GIO<0:7>, which are normal data, to the output lines OUT<0:7> regardless of the selection information INF during a normal operation, when the test signal PT is disabled. Therefore, during a normal operation, the data loaded onto the global lines GIO<0:7> are outputted from the first interface pad 101 through the pipe latch P0, and the data loaded onto the global lines GIO<8:15> are outputted from the second interface pad 102 through the pipe latch P1.

The logic value and transfer relationship of each signal may be different according to how the memory device is designed. The function of the data output unit 130 is to select a different global line whenever the read command RDCMD is applied and transfer the compressed data loaded onto the selected global line to one interface pad from among the plurality of interface pads 101 and 102. Herein, the first interface pad 101 is the pad used to output all of the compressed data, and thus, the first interface pad 101 is connected to the test equipment.

Figure 5:
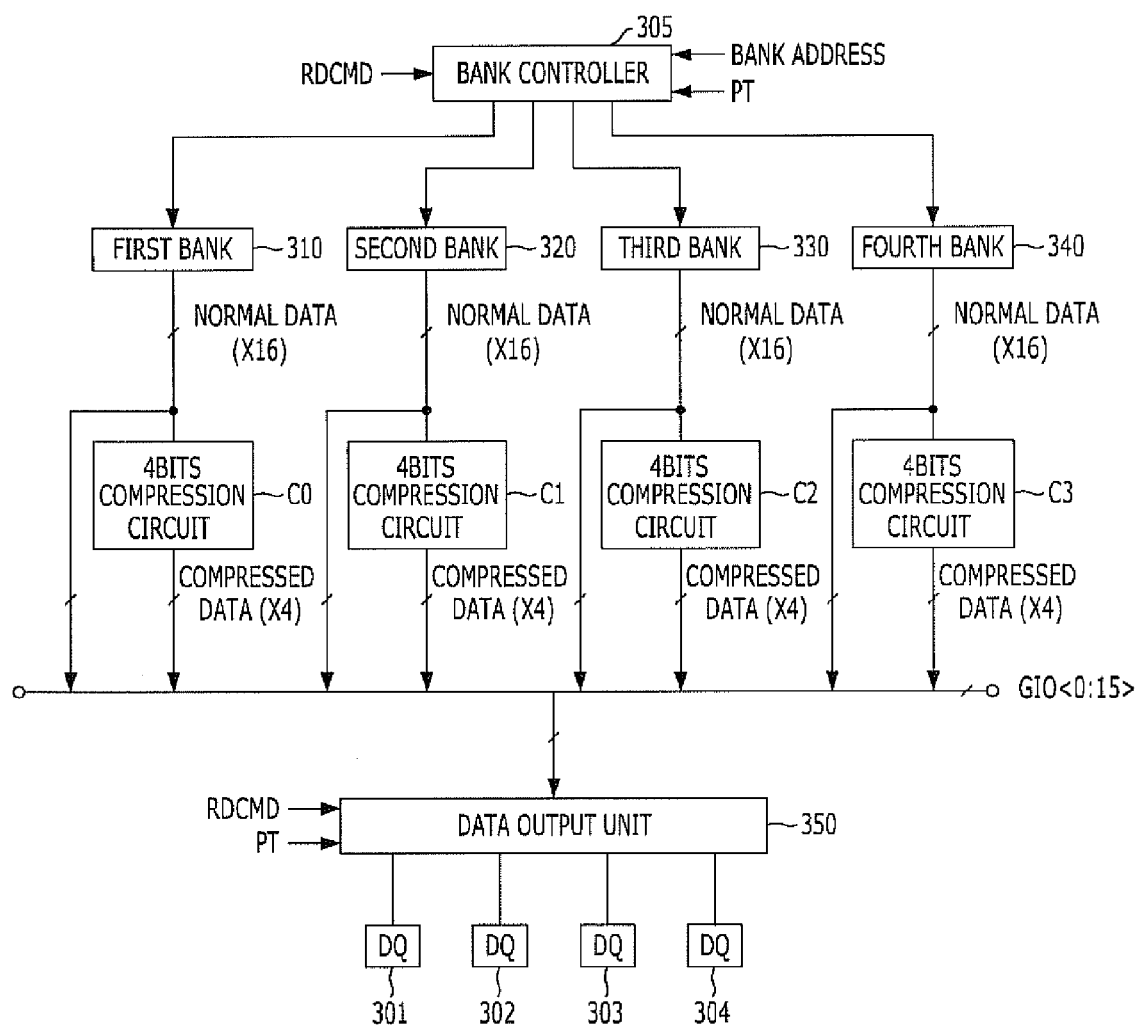
FIG. 5 is a block view illustrating a memory device in accordance with another exemplary embodiment of the present invention.

FIG. 5 is a block view illustrating a memory device in accordance with another exemplary embodiment of the present invention. The memory device shown in FIG. 5 takes advantage of the same principle as that of the memory device shown in FIG. 1.

Referring to FIG. 5, the memory device includes a plurality of banks 310 to 340, a plurality of compression circuits C0 to C3, a plurality of interface pads 301 to 304, and a data output unit 350. The data output unit 350 is configured to sequentially output the compressed data of each bank from among the plurality of banks 310 to 340 through at least one interface pad from among the plurality of interface pads 301 to 304 during a compressive test operation.

FIG. 5 illustrates a case where 16 bits of data (X16 denotes that 16 bits of data are read in FIG. 5) are read from each of the banks 310 to 340 in response to the read command RDCMD. As shown in FIG. 5, the compression circuits C0 to C3 are respectively provided to each of the banks 310 to 340. The compression circuits C0 to C3 compress the 16 bits of data into 4 bits of compressed data (X4 denotes that 4 bits of compressed data are generated in FIG. 5). Accordingly, this compression scheme may be referred to as a 4:1 compression.

When the memory device performs a normal operation, the data read from the banks 310 to 340 and outputted to the outside of the memory device through the multiple interface pads 301 to 304 are referred to as normal data. The normal data are output from the banks 310 to 340 through global lines GIO<0:15> to the data output unit 350 without passing through the compression circuits C0 to C3. Also, when the memory device performs a test operation using compressed data, which is referred to as a compressive test operation, the data read from the banks 310 to 340 and compressed in the compression circuits C0 to C3 are referred to as compressed data.

Referring to FIG. 5, an operation of the memory device is described below.

When the memory device performs the normal operation, a test signal PT is disabled. When memory device performs the compressive test operation, the test signal PT is enabled. Hereafter, a case where the memory device performs a normal operation and a case where the memory device performs a compressive test operation are descried separately.

(1) When the Memory Device Performs a Normal Operation

When the test signal PT is disabled, a bank controller 305 controls the memory device to read data from one bank designated by a bank address BANK ADD in response to a read command RDCMD. In other words, one bank from among the first to fourth banks 310 to 340 according to the bank address BANK ADD is activated. Referring to FIG. 5, when the read command RDCMD is applied, 16 bits of data are read from the bank designated by the bank address BANK ADD.

The 16 bits of normal data outputted from the one bank do not pass through the compression circuits C0 to C3, and instead, are loaded onto the plurality of global lines GI0<0:15>. Here, the 16 bits of normal data are loaded onto sixteen global lines GI0<0:15>, respectively. The data of the global lines GI0<0:15> are transferred to the data output unit 350, and go through a parallel-to-serial conversion in the data output unit 350 before being outputted to the outside of the memory device through the interface pads 301 to 304.

Hereafter, normal operations of a memory device in accordance with the exemplary embodiment of FIG. 5 are described.

In a first exemplary normal operation, when the read command RDCMD is applied while the test signal PT is disabled and the first bank 310 is designated by the bank address BANK ADD, the first bank 310 is activated and 16 bits of data are read from the first bank 310. The 16 bits of data are loaded onto the global lines GI0<0:15>, respectively. The normal data loaded onto the global lines GI0<0:3>, GI0<4:7>, GI0<8:11>, and GI0<12:15> go through a parallel-to-serial conversion. Then, the normal data loaded onto the global lines GI0<0:3> may be sequentially outputted to the outside of the memory device through the interface pad 301, the normal data loaded onto the global lines GI0<4:7> may be sequentially outputted to the outside of the memory device through the interface pad 302, the normal data loaded onto the global lines GI0<8:11> may be sequentially outputted to the outside of the memory device through the interface pad 303, and the normal data loaded onto the global lines GI0<12:15> may be sequentially outputted to the outside of the memory device through the interface pad 304. Alternatively, all of the 16 bits of the normal data may be sequentially outputted through selected interface pads from among the plurality of the interface pads 301 to 304. That is, not all of the interface pads 301 to 304 have to be used in the normal operation.

In a second exemplary normal operation, when the read command RDCMD is applied while the test signal PT is disabled and the second bank 320 is designated by the bank address BANK ADD, the second bank 320 is activated and 16 bits of data are read from the second bank 320. These 16 bits of data are not compressed, and therefore, are normal data. After being read from the second bank 320, the 16 bits of normal data are loaded onto the global lines GI0<0:15>, respectively. Subsequently, the 16 bits of normal data loaded onto the global lines GIO<0:15> go through the same process (i.e., parallel-to-serial conversion) as the 16 bits of normal data read from the first bank 310 and are outputted to the outside of the memory device through one or more of the interface pads 301 to 304. Normal data may be read and outputted from the third bank 330 and the fourth bank 340 in the same manner as described above.

Since the present invention relates to the operation of a memory device during a compressive test operation, and since the process in which data are outputted during a normal operation is well known to those skilled in the art to which the present invention pertains, further description on the normal operation is not provided herein.

(2) When the Memory Device Performs a Compressive Test Operation

When the test signal PT is enabled, a bank controller 305 may control the memory device to read all data from all the banks 310 to 340 in response to the read command RDCMD regardless of a bank address BANK ADD. In other words, all the banks 310 to 340 may be activated. Therefore, referring to FIG. 5, when the read command RDCMD is applied, a total of 64 bits of data may be read from all of the banks 310 to 340. That is, 16 bits of data may be read from each of the first to fourth banks 310 to 340 in response to a first activation of the read command RDCMD.

The 16 bits of data read from each of the first to fourth banks 310 to 340 are each compressed into 4 bits of compressed data by the corresponding compression circuits C0 to C3, respectively. In short, 16 bits of compressed data are produced (4 bits from each bank).

The 4 bits of compressed data of the first bank 310 are loaded onto the global lines GI0<0:3>, respectively. Also, the 4 bits of compressed data of each of the second to fourth bank groups 320, 330, and 340 are loaded onto the global lines GI0<4:7>, GI0<8:11>, and GI0<12:15>, respectively. Then, the 16 bits of data loaded onto the global lines GI0<0:15> are transferred to the data output unit 350. In sum, the compressed data of all of the first to fourth banks 310 to 340 are transferred through the global lines GI0<0:15> all at once in response to the first activation of the read command RDCMD.

The data output unit 350 transfers the compressed data of the first bank group 310 to the outside of the memory device through one or more of the interface pads 301 to 304. For example, the data output unit 350 may transfer the compressed data of the first bank 310 loaded onto the zeroth to third global lines GIO<0:3> through the first interface pad 301 from among the multiple interface pads 301 and 304 in response to the first activation of the read command RDCMD. Subsequently, the compressed data of each bank are outputted to the outside of the memory device through at least one interface pad in response to the second, third, and fourth activation of the read command RDCMD. More specifically, the compressed data of the second bank 320 may be output through the interface pad 301 in response to the second activation of the read command RDCMD, the compressed data of the third bank 330 may be output through the interface pad 301 in response to the third activation of the read command RDCMD, and the compressed data of the fourth bank 340 may be output through the interface pad 301 in response to the fourth activation of the read command RDCMD. In short, the compressed data of the first bank 310 to the compressed data of the fourth bank 340 are sequentially outputted through the same interface pad (e.g., the first interface pad 301).

To this end, the data output unit 350 transfers the compressed data of the first bank 310 loaded onto the zeroth to third global lines GI0<0:3> to the interface pad 301 in response to the first activation of the read command RDCMD. Then, the data output unit 350 transfers the compressed data of the second bank 320 loaded onto the fourth to seventh global lines GI0<4:7> to the interface pad 301 in response to the second activation of the read command RDCMD. Next, the data output unit 350 transfers the compressed data of the third bank 330 loaded onto the eighth to eleventh global lines GIO<8:11> to the interface pad 301 in response to the third activation of the read command RDCMD. And finally, the data output unit 350 transfers the compressed data of the fourth bank 340 loaded onto the twelfth to fifteenth global lines GIO<12:15> to the interface pad 301 in response to the fourth activation of the read command RDCMD. Here, the fourth activation of the read command RDCMD occurs at a time after the third activation of the read command, which occurs at a time after the second activation of the read command, which occurs at a time after the first activation of the read command. Further, the time elapsing between each of the first to fourth activations of the read command may be the same or may be different.

According to known technology, a memory device including four banks uses four interface pads during a compressive test operation to output the compressed data of the four banks all at once. However, according to the memory device of FIG. 5, the compressed data of each of the banks 310 to 340 may be sequentially outputted using one interface pad.

That is, the effect of the memory device shown in FIG. 5 is similar to that of the memory device shown in FIG. 1. In other words, the number of the interface pads required for a compressive test operation may be reduced by selecting lines having compressed data loaded thereon and sequentially outputting the compressed data.

As described above, the compressed data of the multiple banks 310 to 340 are collectively loaded on the global lines GIO<0:15> when the read command RDCMD is first applied after an active command is applied. Herein, the read command RDCMD may be transferred to the banks 310 to 340 via a bank controller 305, which may take a RAS to CAS Delay time (tRCD) into account. The RAS to CAS Delay time (tRCD) refers to the minimum amount of time from the moment when a row active command is applied to a moment when a column active command is applied.

Figure 6:
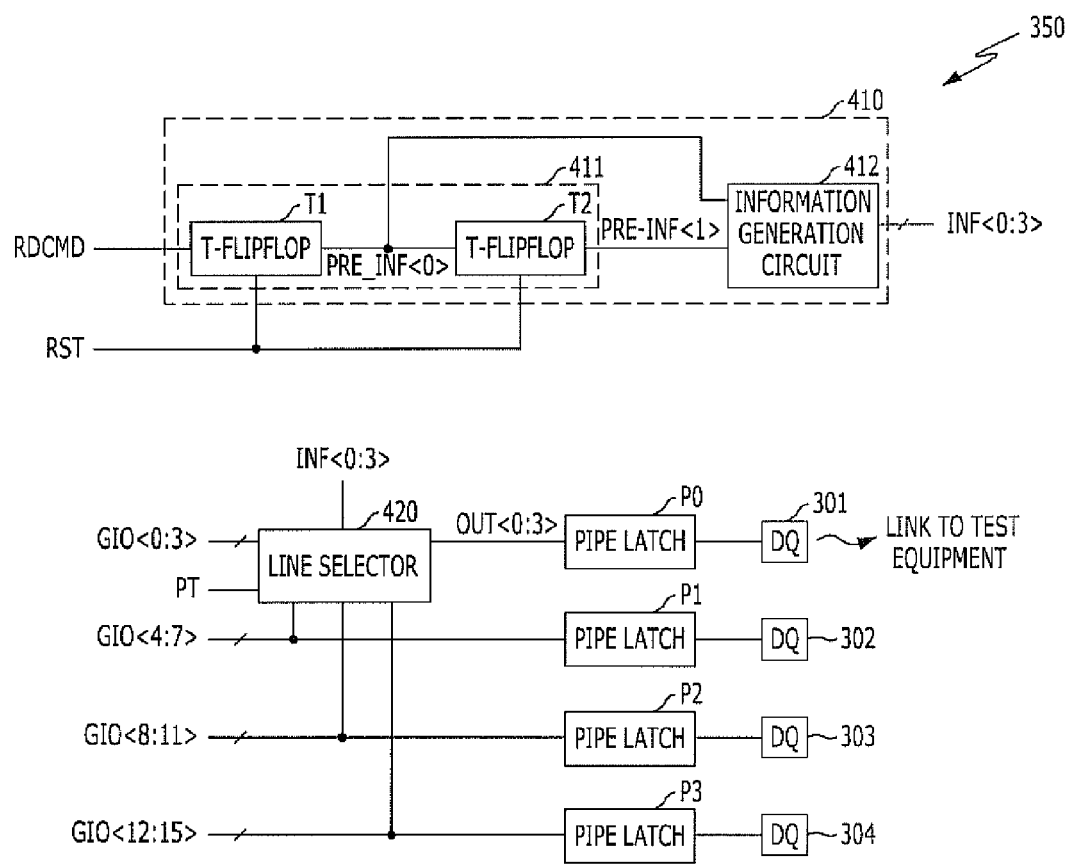
FIG. 6 is a block view illustrating a data output unit 350 shown in FIG. 5.

FIG. 6 is a block view illustrating a data output unit 350 shown in FIG. 5.

Referring to FIG. 6, the data output unit 350 includes a selection information generator 410 and a line selector 420. The selection information generator 410 generates selection information INF<0:3> in response to the read command RDCMD. The line selector 420 selects a subset of global lines from among the plurality of global lines GIO<0:15> in response to the selection information INF<0:3>, and transfers the compressed data loaded onto the selected global lines to at least one interface pad. For example, as shown in FIG. 6, the line selector 420 selects either the zeroth to third global lines GIO<0:3>, the fourth to seventh global lines GIO<4:7>, the eighth to eleventh global lines GIO<8:11>, or the twelfth to fifteenth global lines GIO<12:15>, and transfers the compressed data loaded onto the selected global lines to the first interface pad 301. Also, the data output unit 350 includes pipe latches P0 to P3 for converting the data transferred in parallel through corresponding lines (e.g., zeroth to third global lines GIO<0:3>) into serial data and transferring the serial data to the interface pads 301 to 304.

Figure 7:
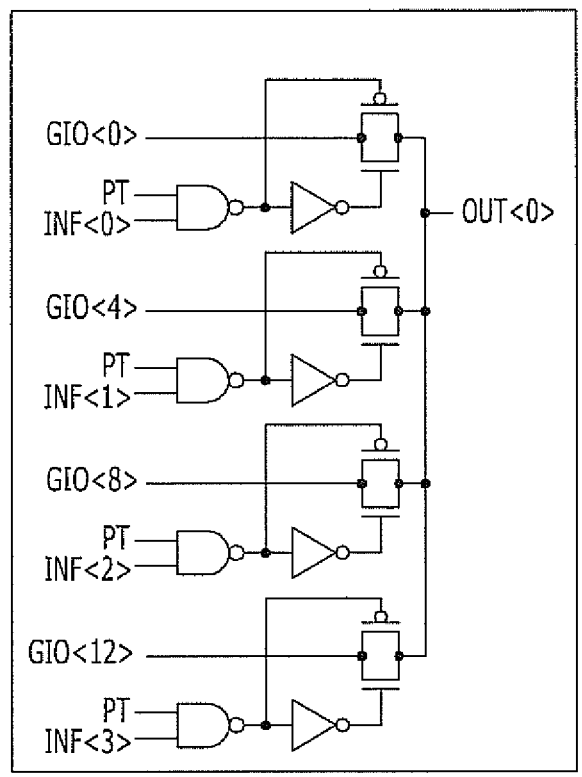
FIG. 7 illustrates a configuration of the line selector 420 shown in FIG. 6.
Figure 7:
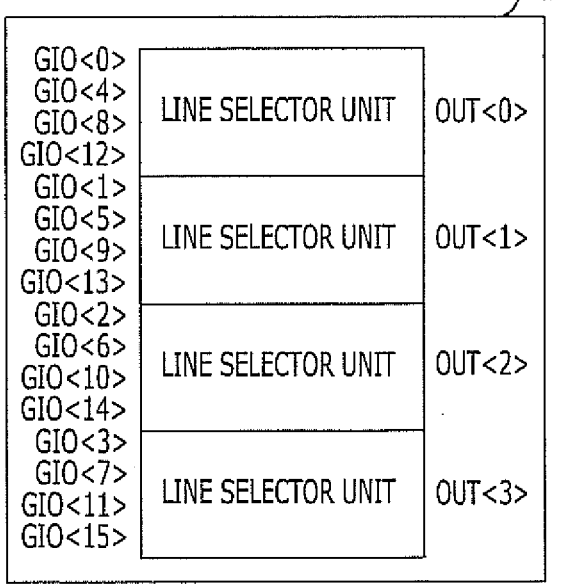

FIG. 7 illustrates a configuration of the line selector 420 shown in FIG. 6. As shown in FIG. 7, the line selector 420 may include a plurality of line selector units. Each line selector unit may be configured to select one of the global lines from among the plurality of global lines GIO<0:15> in response to the selection information INF<0:3> and the test signal PT, and to transfer the compressed data loaded onto the selected global line to an output line coupled to a corresponding interface pad. For example, as shown in FIG. 7, a line selector unit may select either the zeroth global line GIO<0>, the fourth global line GIO<4>, the eighth global line GIO<8>, or the twelfth global line GIO<12> based on the selection information INF<0:3> and the test signal PT, and transfer the compressed data loaded onto the selected global line to an output line OUT<0> coupled to the first interface pad 301.

Figure 8:
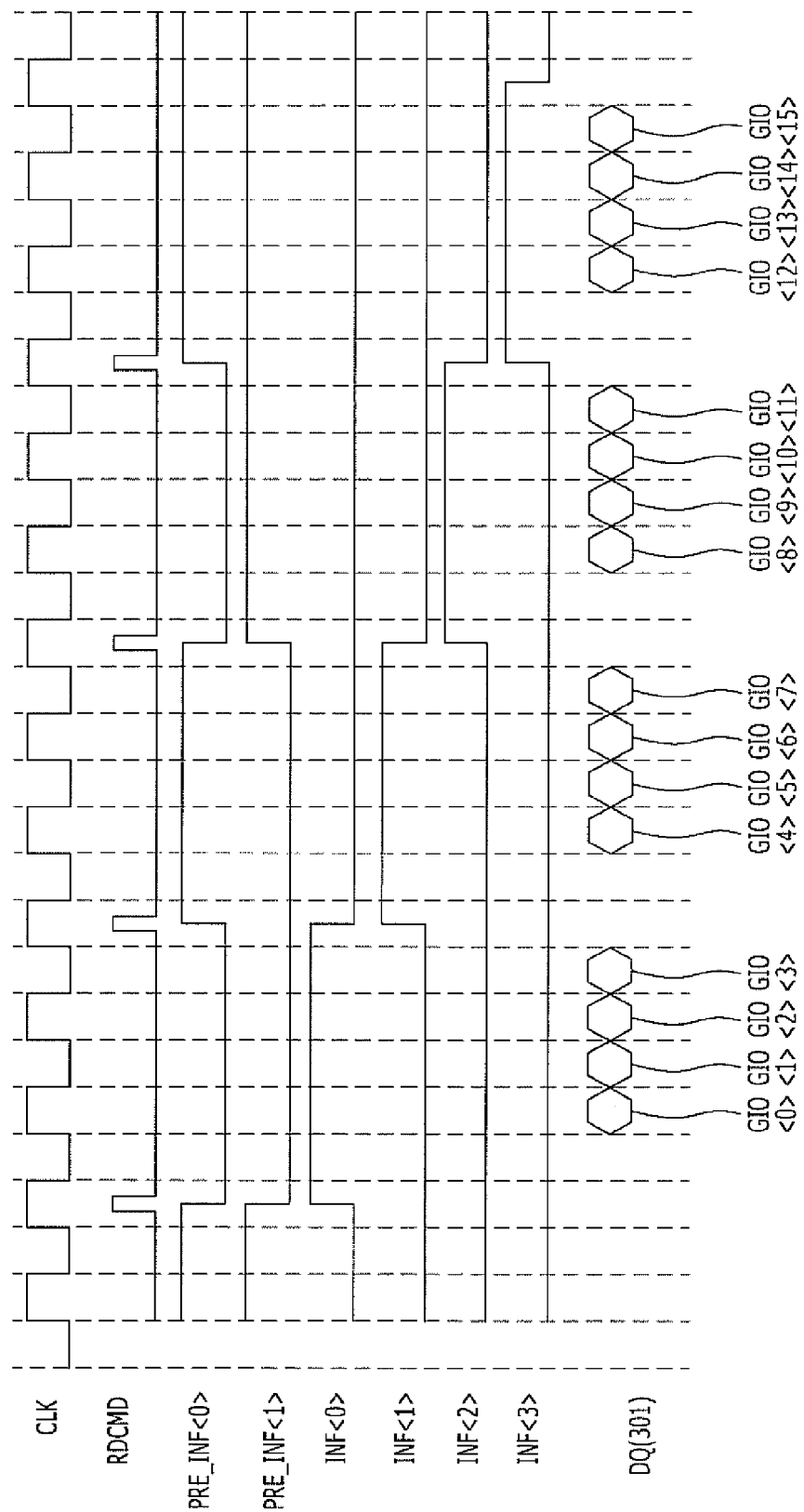
FIG. 8 is a timing diagram for illustrating an operation of the data output unit 350.

FIG. 8 is a timing diagram for illustrating an operation of the data output unit 350. FIG. 8 shows that the 4 bits of compressed data read from the first bank 310 and loaded onto the zeroth to third global lines GIO<0:3> may be sequentially output through the first interface pad 301 after the first activation of the read command RDCMD when the selection information INF<0> is at a first logic level (e.g., a high logic level). Further, FIG. 4 also shows that the 4 bits of compressed data read from the second bank 320 and loaded onto the fourth to seventh global lines GIO<4:7> may be sequentially output through the first interface pad 301 after the second activation of the read command RDCMD when the selection information INF<1> is at the first logic level (e.g., a high logic level). Moreover, FIG. 4 also shows that the 4 bits of compressed data read from the third bank 330 and loaded onto the eighth to eleventh global lines GIO<8:11> may be sequentially output through the first interface pad 301 after the third activation of the read command RDCMD when the selection information INF<2> is at the first logic level (e.g., a high logic level). And finally, FIG. 4 shows that the 4 bits of compressed data read from the fourth bank 340 and loaded onto the twelfth to fifteenth global lines GIO<12:15> may be sequentially output through the first interface pad 301 after the fourth activation of the read command RDCMD when the selection information INF<3> is at the first logic level (e.g., a high logic level).

Hereafter, an operation of the data output unit 350 is described with reference to FIGS. 6-8.

The selection information generator 410 is used during a compressive test operation. The selection information generator 410 generates or updates the selection information INF<0:3> whenever a read command RDCMD is applied. The selection information INF<0:3> are signals used when the line selector 420 selects global lines to be used. The value of the selection information INF<0:3> changes whenever the read command RDCMD is applied.

The selection information generator 410 includes a preliminary information generation circuit 411 for generating preliminary information PRE_INF<0:1> in response to the read command RDCMD and an information generation circuit 412 for generating the selection information INF<0:3> based on the preliminary information PRE_INF<0:1>.

As shown in FIG. 8, during a compressive test operation, the selection information INF<0:3> has different values when the first to fourth read commands RDCMD are applied. For example, when the read command RDCMD is first applied, the selection information INF<0:3> may be (0, 0, 0, 1), which indicates that the signal INF<0> is activated, while the signals INF<1>, INF<2>, and INF<3> are inactive. And, when the read command RDCMD is applied a second time the selection information INF<0:3> may be (0, 0, 1, 0), which indicates that the signal INF<1> is activated, while the signals INF<0>, INF<2>, and INF<3> are inactive. Also, when the read command RDCMD is applied a third time, the selection information INF<0:3> may be (0, 1, 0, 0), which indicates that the signal INF<2> is activated, while the signals INF<0>, INF<1>, and INF<3> are inactive, and when the read command RDCMD is applied a fourth time, the selection information INF<0:3> may be (1, 0, 0, 0), which indicates that the signal INF<3> is activated, while the signals INF<0>, INF<1>, and INF<2> are inactive.

To this end, the preliminary information generation circuit 411 changes the logic value of the preliminary information PRE_INF<0:1> whenever the read command RDCMD is applied. The preliminary information generation circuit 411 may include a first T-filpflop T1 which receives the read command RDCMD as an input and outputs the preliminary information PRE_INF<0> and a second T-filpflop T2 which receives the read command RDCMD as an input and outputs the preliminary information PRE_INF<1>. In this case, when the read command RDCMD is first applied, the preliminary information PRE_INF whose logic value is (0, 0), which indicates that both signal PRE_INF<0> and signal PRE_INF<1> are inactive, is generated. And, when the read command RDCMD is applied a second, third, and fourth time, the preliminary information PRE_INF<0:1> has logic values (0, 1), which indicates the signal PRE_INF<0> is active and the signal PRE_INF<1> is inactive, (1, 0), which indicates the signal PRE_INF<0> is inactive and the signal PRE_INF<1> is active, and (1, 1), which indicates both signal PRE_INF<0> and signal PRE_INF<1> are active, respectively. The information generation circuit 412 generates the selection information INF<0:3> based on the logic value of the preliminary information PRE_INF<0:1>. The information generation circuit 412 may be a decoder which generates the selection information INF<0:3> by decoding the preliminary information PRE_INF<0:1>.

The selection information generator 410 shown in FIG. 6 is a mere example. The selection information generator 410 generates selection information having a number of signals that allow the number of banks to be distinguished by the line selector 420, and changes the value of the selection information whenever the read command RDCMD is applied. Since the selection information INF<0:3> has to have four different values in FIG. 6, the selection information INF<0:3> may have four digital signals collectively representing tow bits. Further, a reset signal RST may also be input to the selection information generator 410. The reset signal RST is a signal for initializing the output signals PRE_INF<0> and PRE_INF<1> of the T-flipflops T1 and T2 to a specific logic level, for example, a high logic level representing a '1'.

The line selector 420 transfers the compressed data of the global lines selected based on the selection information INF<0:3> from among the plurality of global lines GI0<0:15> during the compressive test operation to a plurality of output lines OUT<0:3>. The data loaded on the output lines OUT<0:3> goes through a parallel-to-serial conversion in the pipe latch P0 and are outputted to the outside of the memory device through the first interface pad 301.

In the above example, when the selection information INF<0:3> is (0, 0, 0, 1), that is, when the read command RDCMD is first applied, the data loaded on the global lines GI0<0:3>, which are the compressed data of the first bank 310, are transferred to the output lines OUT<0:3>. When the selection information INF<0:3> is (0, 0, 1, 0), that is, when the read command RDCMD is applied a second time, the data loaded on the global lines GI0<4:7>, which are the compressed data of the second bank 320, are transferred to the output lines OUT<0:3>. When the selection information INF<0:3> is (0, 1, 0, 0), that is, when the read command RDCMD is applied a third time, the data loaded on the global lines GI0<8:11>, which are the compressed data of the third bank 330, are transferred to the output lines OUT<0:3>. When the selection information INF<0:3> is (1, 0, 0, 0), that is, when the read command RDCMD is applied a fourth time, the data loaded on the global lines GI0<12:15>, which are the compressed data of the fourth bank 340, are transferred to the output lines OUT<0:3>.

The line selector 420 transfers the data loaded onto the global lines GI0<0:3>, which are normal data, to the output lines OUT<0:3> regardless of the selection information INF<0:3> during a normal operation, when the test signal PT is disabled. Therefore, during a normal operation, the data loaded onto the global lines GI0<0:3> are outputted from the first interface pad 301 through the pipe latch P0, and the data loaded onto the global lines GI0<4:7>, GI0<8:11>, and GI0<12:15> are outputted from the interface pads 302, 303 and 304 through the pipe latches P1, P2 and P3, respectively.

The logic value and transfer relationship of each signal may be different according to how the memory device is designed. The function of the data output unit 350 is to select a different global line whenever the read command RDCMD is applied and transfer the compressed data loaded onto the selected global line to at least one interface pad among the plurality of interface pads 301 to 304. Herein, the at least one interface pad is the first interface pad 301, which is used to output all of the compressed data, and thus, the first interface pad 301 is connected to the test equipment.

Figure 9:
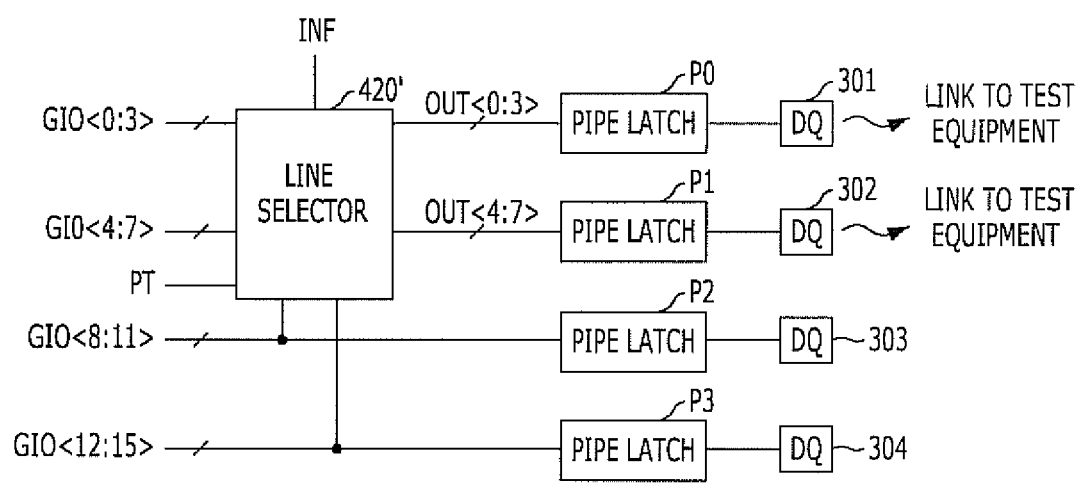
FIG. 9 is a block view illustrating a portion of the data output unit 350 in accordance with another exemplary embodiment of the present invention.

FIG. 9 is a block view illustrating a portion of the data output unit 350 in accordance with another exemplary embodiment of the present invention.

FIG. 9 shows a data output unit 350 which allows the compressed data of two banks to be outputted in response to a single activation of the read command RDCMD. In FIG. 9, it is assumed that the compressed data of one bank is outputted to the first interface pad 301, while the compressed data of another bank is outputted to the second interface pad 302. This may be different according to how the data output unit 350 is designed. For example, the compressed data of the first bank 310 and the second bank 320 may be outputted in the same duration, and the compressed data of the third bank 330 and the fourth bank 340 may be outputted in the same duration.

The structure of the path and the operation until the compressed data reach the data output unit 350 are similar to those described with reference to FIGS. 5-8. The difference between the exemplary embodiment of FIG. 6 and the exemplary embodiment of FIG. 9 is in the manner in which the data loaded onto the global lines GI0<0:15> are transferred to the interface pads 301 to 304. This difference is described hereafter.

The data output unit 350 in FIG. 9 includes the information generation circuit 212 of FIG. 2 and the line selector 420' of FIG. 9. The structure and operation of the information generation circuit 212 are the same as described with reference to FIG. 2, and thus, further description of them is omitted here.

The line selector 420' transfers the compressed data of the global lines selected based on the selection information INF from among the plurality of global lines GI0<0:15> to the zeroth to third output lines OUT<0:3> or the fourth to seventh output lines OUT<4:7> during a compressive test operation, in which a test signal PT is enabled. The data loaded onto the zeroth to third output lines OUT<0:3> go through a parallel-to-serial conversion in the pipe latch P0 and are outputted through the first interface pad 301, while the data loaded on the fourth to seventh output lines OUT<4:7> go through a parallel-to-serial conversion in the pipe latch P1 and are outputted through the second interface pad 302.

In the above example, in response to the first activation of the read command RDCMD, the data loaded onto the zeroth to third global lines GI0<0:3>, which are the compressed data of the first bank 310, are transferred to the zeroth to third output lines OUT<0:3>, and the data loaded onto the fourth to seventh global lines GI0<4:7>, which are the compressed data of the second bank 320, are transferred to the fourth to seventh output lines OUT<4:7> in a case where the selection information INF has a first logic level (e.g., a low logic level of '0'). Subsequently, in response to the second activation of the read command RDCMD, the data loaded onto the eighth to eleventh global lines GI0<8:11>, which are the compressed data of the third bank 330, are transferred to the zeroth to third output lines OUT<0:3> and the data loaded onto the twelfth to fifteenth global lines GI0<12:15>, which are the compressed data of the fourth bank 340, are transferred to the fourth to seventh output lines OUT<4:7> in a case where the selection information INF has a second logic level (e.g., a high logic level of '1'.

Through this process, the data loaded onto the global lines GI0<0:3> and GI0<8:11> are sequentially outputted through the pipe latch P0 and the first interface pad 301. Also, the data loaded onto the global lines GIO<4:7> and GI0<12:15> are sequentially outputted through the pipe latch P1 and the second interface pad 302. In short, the compressed data of a plurality of banks may be outputted in the same duration in response to a single activation of the read command RDCMD. In such a case, more than one interface pad (e.g., the first and second interface pads 301 and 302) from among the plurality of interface pads may be connected to the test equipment.

During the compressive test operation, as the number of interface pads used by one memory device is increased, the time taken for testing the memory device may be reduced. Conversely, as the number of interface pads used by one memory device is decreased, the number of memory devices that may be tested simultaneously with the same test equipment may be increased.

Hereafter, a method for testing a memory device in accordance with an exemplary embodiment of the present invention is described by referring back to FIGS. 1 to 4.

The memory device testing method according to an exemplary embodiment of the present invention includes: applying a read command RDCMD; reading data from the first bank 110 and the second bank 120 in response to the read command RDCMD; compressing the data outputted from the first bank 110 and the second bank 120 to thereby produce compressed data; outputting the compressed data of the first bank 110 to at least one interface pad 101 from among a plurality of interface pads 101 and 102 in response to the read command RDCMD; applying the read command RDCMD a second time; and outputting compressed data of the second bank 120 to at least one interface pad 101 in response to the second activation of the read command RDCMD.

When the read command RDCMD is first applied, the compressed data of the first bank 110 and the second bank 120 are transferred to the global lines GI0<0:15>.

Also, when the read command RDCMD is first applied, the compressed data of the first bank 110, which are the data loaded onto the global lines GI0<0:7>, among the compressed data of the global lines GI0<0:15>, go through a parallel-to-serial data conversion and are transferred to the at least one interface pad 101. When the read command RDCMD is applied a second time, the compressed data of the second bank 120, which are the data loaded onto the global lines GI0<8:15>, among the compressed data of the global lines GI0<0:15>, go through a parallel-to-serial data conversion and are transferred to the at least one interface pad 101.

In short, after the compressed data of the first bank 110 are outputted through the at least one interface pad 101, the compressed data of the second bank 120 are outputted through the at least one interface pad 101.

Hereafter, a method for testing a memory device in accordance with an exemplary embodiment of the present invention is described by referring back to FIGS. 5 to 9.

The method for testing a memory device in accordance with another exemplary embodiment of the present invention includes: applying a read command RDCMD; reading data from a plurality of banks in response to the read command RDCMD; compressing the data read from the banks; outputting the compressed data of at least one bank from among the plurality of banks to at least one interface pad from among a plurality of interface pads in response to the read command RDCMD; applying the read command RDCMD a second time; and outputting compressed data of at least one other bank from among the plurality of banks to the at least one interface pad from among a plurality of interface pads in response to the second activation of the read command RDCMD. Accordingly, the compressed data of the plurality of banks may be outputted sequentially (i.e., compressed data of each bank is output one at a time) or the banks may be grouped so that compressed data of banks in the same group may be output at the same time. For example, with reference to FIGS. 5 and 9, the first bank 310 and second bank 320 may form a first group, while the third bank 330 and the fourth bank 340 form a second group.

When the read command RDCMD is first applied, the compressed data of the plurality of banks are transferred to a plurality of global lines GI0<0:15>. In short, the compressed data of the plurality of banks are transferred to the plurality of global lines GI0<0:15> in the same duration. Hereafter, a case where compressed data of each bank is output sequentially and a case where compressed data of a group of banks is output at the same time are described.

When the compressed data of each bank of the plurality of banks are outputted one at a time, the compressed data are outputted whenever the read command RDCMD is applied. Therefore, the compressed data of the first to fourth banks 310 to 340 are sequentially outputted through the interface pad 301 in response to the first to fourth activations of the read command RDCMD, respectively.

When two banks are grouped together (in this case, the first bank group includes the first bank and the second bank, and the second bank group includes the third bank and the fourth bank), the compressed data of the two banks of one bank group are outputted whenever the read command RDCMD is applied. Therefore, the compressed data of the first bank group including the first bank 310 and the second bank 320 are outputted to the interface pads 301 and 302 in response to the first activation of the read command RDCMD, and the compressed data of the second bank group including the third bank 330 and the fourth bank 340 are outputted to the interface pads 301 and 302 in response to the second activation of the read command RDCMD.

Looking at the process in terms of each interface pad, the compressed data of the first bank 310 and the compressed data of the third bank 330 may be sequentially outputted through the interface pad 301. Also, the compressed data of the second bank 320 and the compressed data of the fourth bank 340 may be sequentially outputted through the interface pad 302.

The memory device testing method in accordance with the exemplary embodiments of the present invention has an advantage in that it may test many memory devices at one time by decreasing the number of interface pads required for each memory device when a compressive test operation is performed onto a plurality of memory devices.

According to the technology of the present invention, a compressive test is performed by sequentially outputting the output data of one or more banks from among a plurality of banks in response to a read command inputted consecutively.

Since the number of interface pads used for performing a compressive test for each chip can be decreased, the compressive test may be performed onto many chips all at once, which may lead to a reduced time for performing the compressive test.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
   a first bank;
   a second bank;
   a plurality of interface pads; and
   a data output unit configured to sequentially output compressed data of the first bank through one interface pad among the plurality of interface pads and subsequently output compressed data of the second bank through the one interface pad,
   wherein output timings of the compressed data of the first bank and the compressed data of the second bank to the one interface pad are determined in response to a read command and the one interface pad is selected based on the read command.

2. The memory device of claim 1, wherein the compressed data of the first bank are outputted in response to a first activation of the read command, and the compressed data of the second bank are outputted in response to a second activation of the read command.

3. The memory device of claim 1, wherein the compressed data of the first bank and the compressed data of the second bank are loaded to a plurality of global lines in response to the first activation of the read command.

4. The memory device of claim 3, wherein the data output unit comprises:
   a selection information generator configured to generate selection information in response to the first activation of the read command and the second activation of the read command; and
   a line selector configured to select a group of global lines from among the plurality of global lines in response to the selection information and to transfer one of the compressed data of the first bank and the compressed data of the second bank loaded onto the selected group of the global lines to the one interface pad.

5. The memory device of claim 4, wherein the line selector receives a test signal and selects the group of global lines from among the plurality of global lines based on the test signal.

6. The memory device of claim 4, wherein the selection information generator updates the selection information whenever the read command is activated.

7. The memory device of claim 4, wherein the line selector transfers the compressed data of the first bank to the one interface pad in response to the selection information generated based on the first activation of the read command, and transfers the compressed data of the second bank to the one interface pad in response to the selection information generated based on the second activation of the read command.

8. The memory device of claim 4, wherein the selection information generator comprises a T-flip flop configured to change the selection information whenever the read command is activated and to reset the selection information to a predetermined value whenever a reset signal is activated.

9. The memory device of claim 4, wherein the selection information generator comprises:
   a preliminary information generation circuit configured to generate preliminary selection information in response to the first activation of the read command and the second activation of the read command; and
   an information generation circuit configured to generate the selection infoiniation based on the preliminary selection information.

10. The memory device of claim 9, wherein the selection information comprises a plurality of signals.

11. The memory device of claim 4, wherein the data output unit further comprises a pipe latch configured to convert one of the compressed data of the first bank and the compressed data of the second bank loaded onto the selected group of the global lines according to the selection information to serial data before one of the compressed data of the first bank and the compressed data of the second bank is output through the one interface pad.

12. The memory device of claim 2, wherein the compressed data of the first bank and the compressed data of the second bank are obtained by compressing a data outputted from the first bank and a data outputted from the second bank, respectively, in response to the first activation of the read command.

13. The memory device of claim 1, further comprising:
   a first compression circuit configured to compress data read from the first bank when a test signal is enabled; and
   a second compression circuit configured to compress data read from the second bank when the test signal is enabled.

14. A memory device, comprising:
   a plurality of bank groups each including at least one bank;
   a plurality of interface pads; and
   a data output unit configured to output compressed data of one bank group from among the plurality of bank groups to at least one interface pad from among the plurality of interface pads at once during a compressive test operation, wherein compressed data of different bank groups from among the plurality of bank groups are sequentially outputted,
   wherein output timings of the compressed data of the plurality of bank groups to the at least one interface pad are determined in response to a read command and the one interface pad is selected based on the read command.

15. The memory device of claim 14, wherein the compressed data of one bank group from among the plurality of bank groups are outputted through the at least one interface pad whenever a read command is applied.

16. The memory device of claim 14, wherein the compressed data of the one bank group are loaded to a plurality of global lines in response to a first activation of a read command.

17. The memory device of claim 16, wherein the data output unit comprises:
   a selection information generator configured to generate selection information in response to the read command; and
   a line selector configured to select a group of global lines from among the plurality of global lines in response to the selection information and to transfer the compressed data of the one bank group loaded onto the selected group of the global lines to the at least one interface pad.

18. The memory device of claim 17, wherein the selection information generator updates the selection information whenever the read command is activated.

19. A method for testing a memory device, comprising:
   applying a first read command;
   reading data from a first bank and data from a second bank in response to the first read command;

compressing the data read from the first bank and the data read from the second bank to thereby produce a first compressed data and a second compressed data;

outputting the first compressed data of the first bank to at least one interface pad from among a plurality of interface pads in response to the first read command;

applying a second read command; and outputting the second compressed data of the second bank to the at least one interface pad in response to an activation of the second read command, wherein output timings of the first compressed data of the first bank and the second compressed data of the second bank to the one interface pad are determined in response to a read command and the one interface pad is selected based on the read command.

20. The method of claim 19, wherein when the first read command is applied, the first compressed data of the first bank and the second compressed data of the second bank are loaded to a plurality of global lines.

21. The method of claim 20, wherein when the first read command is applied, the first compressed data of the first bank loaded onto the plurality of global lines are transferred to the at least one interface pad, and when the second read command is applied, the second compressed data of the second bank loaded onto the plurality of global lines are transferred to the at least one interface pad.

22. A method for testing a memory device, comprising:

applying a first read command;

reading data from a plurality of banks in response to the first read command;

compressing the data read from the plurality of banks;

outputting a first compressed data of at least one bank from among the plurality of banks to at least one interface pad in response to the first read command, wherein the one interface pad is selected based on the first read command;

applying a second read command; and outputting a second compressed data of at least one other bank from among the plurality of banks to the at least one interface pad in response to the second activation of the second read command, wherein output timings of the first compressed data and the second of the plurality of bank to the at least one interface pad are determined in response to the first and second read commands.

23. The method of claim 22, wherein when the first read command is applied, the first compressed data of the plurality of banks is loaded to a plurality of global lines.

24. The method of claim 22, wherein the number of interface pads used to output the first compressed data and the second compressed data corresponds to the number of banks from which compressed data is output.

25. A memory system comprising:

a bank controller configured to receive a bank address and a test signal, and to transfer a read command in response to the bank address and test signal;

a plurality of banks configured to receive the read command and output normal data;

a plurality of compression circuits configured to receive the normal data and generate compressed data when the test signal is enabled;

a plurality of global lines configured to load and transfer the normal data or the compression data;

a plurality of interface pads, wherein a interface pad from among the plurality of interface pads is selected based on the read command as a selected interface pad and is coupled to test equipment; and a data output unit configured to receive data loaded onto the plurality of global lines, to output compressed data of at least one bank from among the plurality of banks through the selected interface pad, and to subsequently output compressed data of at least one other bank from among the plurality of banks through the selected interface pad, wherein output timings of the compressed data of the plurality of bank to the selected interface pad are determined in response to a read command.

* * * * *